(12) United States Patent
Nouri

(10) Patent No.: US 9,724,755 B2
(45) Date of Patent: Aug. 8, 2017

(54) CONTROLLED DIRECTIONAL SOLIDIFICATION OF SILICON

(71) Applicant: Silicor Materials Inc., San Jose, CA (US)

(72) Inventor: Abdallah Nouri, Brampton (CA)

(73) Assignee: Silicor Materials, Inc., San Jose, CA (US)

( * ) Notice: Subject to any disclaimer, the term of this patent is extended or adjusted under 35 U.S.C. 154(b) by 265 days.

(21) Appl. No.: 14/409,433

(22) PCT Filed: Jun. 25, 2013

(86) PCT No.: PCT/US2013/047582
§ 371 (c)(1),
(2) Date: Dec. 18, 2014

(87) PCT Pub. No.: WO2014/004481
PCT Pub. Date: Jan. 3, 2014

(65) Prior Publication Data
US 2015/0337454 A1    Nov. 26, 2015

Related U.S. Application Data

(60) Provisional application No. 61/663,940, filed on Jun. 25, 2012.

(51) Int. Cl.
| | | |
|---|---|---|
| C30B 11/02 | (2006.01) |
| B22D 27/04 | (2006.01) |
| C30B 11/00 | (2006.01) |
| C30B 29/06 | (2006.01) |

(52) U.S. Cl.
CPC .......... B22D 27/045 (2013.01); C30B 11/002 (2013.01); C30B 11/003 (2013.01); C30B 29/06 (2013.01); Y10T 117/1092 (2015.01)

(58) Field of Classification Search
CPC ........................................................ C30B 11/02
See application file for complete search history.

(56) References Cited

U.S. PATENT DOCUMENTS 5,961,944 A    10/1999   Aratani et al.
5,972,107 A    10/1999   Schmid et al.
(Continued)

FOREIGN PATENT DOCUMENTS

CN    101194051 A    6/2008
JP    10-139580 A    5/1998
(Continued)

OTHER PUBLICATIONS

"Japanese Application Serial No. 2015-520396, Office Action mailed Jan. 27, 2016", (w/ English Translation), 7 pgs.
(Continued)

*Primary Examiner* — Robert M Kunemund
(74) *Attorney, Agent, or Firm* — Schwegman Lundberg & Woessner, P.A.

(57) ABSTRACT

The present invention relates to an apparatus and method for directional solidification of silicon. The apparatus can use a cooling platform to cool a portion of a bottom of a directional solidification crucible. The apparatus and method of the present invention can be used to make silicon crystals for use in solar cells.

19 Claims, 9 Drawing Sheets

(56) References Cited

U.S. PATENT DOCUMENTS

| | | | | |
|---|---|---|---|---|
| 2010/0052218 | A1* | 3/2010 | Clark | C30B 11/003 |
| | | | | 264/299 |
| 2012/0067540 | A1* | 3/2012 | Nouri | B22D 27/045 |
| | | | | 164/338.1 |
| 2012/0119407 | A1 | 5/2012 | Nichol et al. | |

FOREIGN PATENT DOCUMENTS

| | | |
|---|---|---|
| JP | 2014-534401 A | 12/2014 |
| JP | 2015-527964 A | 9/2015 |
| TW | 201319337 A | 5/2013 |
| WO | WO-2014/004481 A1 | 1/2014 |
| WO | WO-2014/004481 A9 | 1/2014 |

OTHER PUBLICATIONS

"Japanese Application Serial No. 2015-520396, Written Amendment filed Apr. 13, 2016 in response to Office Action mailed Jan. 27, 2016", (English Translation), 5 pgs.

"Korean Application Serial No. 10-2015-7001906, Office Action mailed May 16, 2016", W/ English Translation, 16 pgs.

"International Application Serial No. PCT/US2013/047582, International Preliminary Report on Patentability mailed Jan. 8, 2015", 10 pgs.

"International Application Serial No. PCT/US2013/047582, International Search Report mailed Aug. 23, 2013", 4 pgs.

"International Application Serial No. PCT/US2013/047582, Written Opinion mailed Aug. 23, 2013", 8 pgs.

"Japanese Application Serial No. 2015-520396, Amendment filed Feb. 19, 2015", (w/ English Translation of Amendment), 56 pgs.

"Taiwanese Application Serial No. 102122411, Office Action mailed Jan. 12, 2015", (w/ English Translation), 11 pgs.

"Taiwanese Application Serial No. 102122411, Response filed Apr. 14, 2015 to Office Action mailed Jan. 12, 2015", (w/ English Translation of Claims), 112 pgs.

"Chinese Application Serial No. 201380044144.0, Office Action mailed Jan. 5, 2017", 4 pgs.

"Chinese Application Serial No. 201380044144.0, Office Action mailed Jun. 14, 2016", with English translation obtained from internet. URL: <https://globaldossier.uspto.gov/#/details/CN/201380044144/A/115270>, 23 pgs.

"Chinese Application Serial No. 201380044144.0, Response filed Oct. 25, 2016 to Office Action mailed Jun. 14, 2016", pending claims in English, 22 pgs.

\* cited by examiner

CONTROLLED DIRECTIONAL SOLIDIFICATION OF SILICON

RELATED APPLICATIONS

This application is a U.S. National Stage Filing under 35 U.S.C. §371 from International Application No. PCT/US2013/047582, entitled "CONTROLLED DIRECTIONAL SOLIDIFICATION OF SILICON," filed on Jun. 25, 2013, and published as WO 2014/004481 A1 on Jan. 3, 2014, which claims the benefit of priority to U.S. Provisional Application No. 61/663,940, filed Jun. 25, 2012, which are hereby incorporated by reference in their entireties.

BACKGROUND

Solar cells can be a viable energy source by utilizing their ability to convert sunlight to electrical energy. Silicon is a semiconductor material used in the manufacture of solar cells; however, a limitation of silicon use relates to the cost of purifying it to solar grade (SG).

Several techniques used to make silicon crystals for solar cells are known. Most of these techniques operate on the principle that while silicon is solidifying from a molten solution, undesirable impurities tend to remain in the molten solution. For example, the float zone technique can be used to make monocrystalline ingots, and uses a moving liquid zone in a solid material, moving impurities to edges of the material. In another example, the Czochralski technique can be used to make monocrystalline ingots, and uses a seed crystal that is slowly pulled out of a solution, allowing the formation of a monocrystalline column of silicon while leaving impurities in the solution. In yet another example, the Bridgeman process or heat exchanger techniques can be used to make multicrystalline and monocystalline ingots, and use a temperature gradient toward the central axis of the ingot in the direction of solidification to cause directional solidification. Such techniques utilize highly insulated ingot sides. Due to the lack of contact of the silicon with the crucible during the solidification, the dimensions of the ingot and the cost of the production compare to the Bridgman technique.

Various techniques utilizing temperature gradients for directional solidification of silicon can utilize a number of cooling or heating mechanisms. Such temperature control mechanisms can involve relatively expensive and difficult to maintain cooling or heating conduits within a directional solidification crucible.

BRIEF DESCRIPTION OF THE DRAWINGS

In the drawings, which are not necessarily drawn to scale, like numerals describe substantially similar components throughout the several views. Like numerals having different letter suffixes represent different instances of substantially similar components. The drawings illustrate generally, by way of example, but not by way of limitation, various embodiments and designs are discussed in the present document.

SUMMARY

Figure 1:
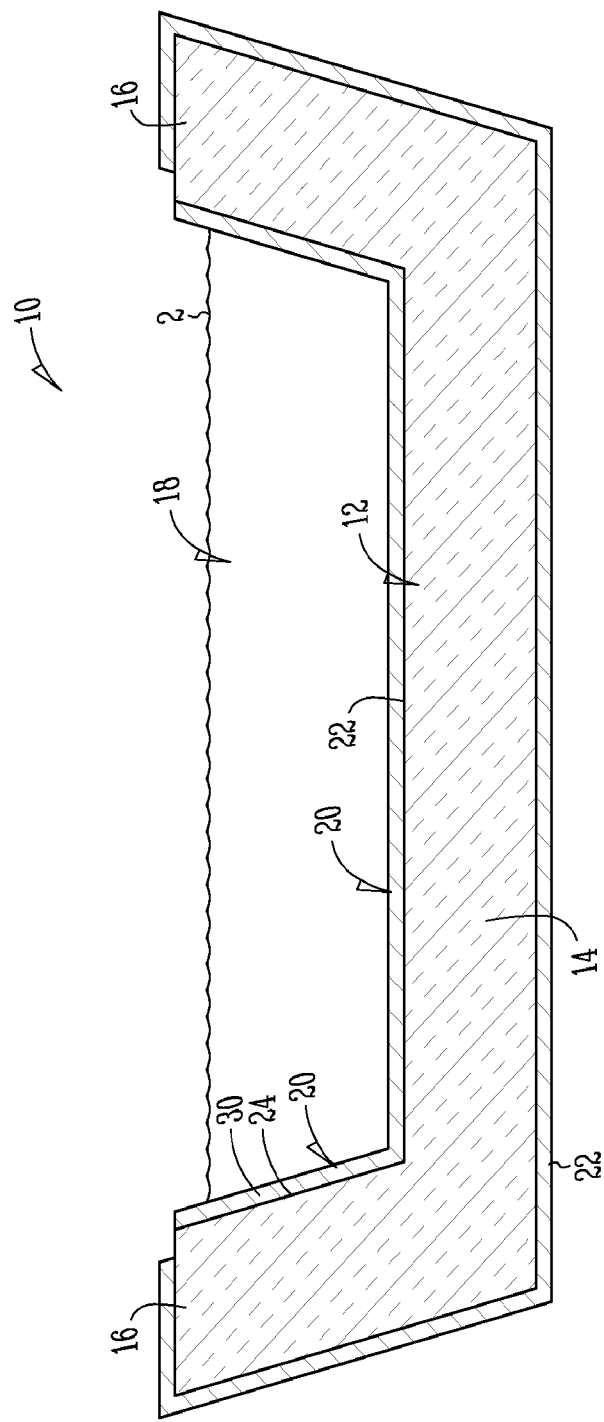
FIG. 1 is a cross-sectional view of an example of a directional solidification crucible that can be used for the purification of silicon, as constructed in accordance with at least one embodiment.

In view of current energy demands and supply limitations, the present inventor has recognized a need for a more cost efficient way of purifying metallurgical grade (MG) silicon (or any other silicon having a greater amount of impurities than solar grade) to solar grade silicon. This method can be used for other materials like sapphire.

In various embodiments, the present invention provides an apparatus for directional solidification. The apparatus includes a directional solidification crucible. The directional solidification crucible includes a bottom. The apparatus also includes a cooling platform. The cooling platform includes a first surface. The first surface defines an orifice configured to receive a portion of the bottom of the directional solidification crucible. The cooling platform also includes a cooling duct. The cooling duct is configured to provide a portion of forced air to the portion of the bottom of the directional solidification crucible.

In an example, a plurality of side walls of the directional solidification crucible include a hot face refractory.

In an example, the bottom of the directional solidification crucible includes a conducting refractory.

In an example, the portion of the bottom of the directional solidification crucible dissipates heat at a rate of about 10% per hour with the forced air.

In an example, at least the portion of the bottom of the directional solidification crucible includes a plurality of heat transfer fins configured to dissipate heat.

In an example, at least a portion of the plurality of heat transfer fins extend outwardly along the bottom of the directional solidification crucible.

In an example, the heat transfer fins include flat bar.

In an example, the heat transfer fins include stainless steel.

In an example, at least the portion of the bottom of the directional solidification crucible includes a convex surface configured to sit within the orifice.

In an example, the orifice receives substantially a center of the bottom of the directional solidification crucible.

In an example, the orifice is configured to receive the portion of the bottom of the directional solidification crucible by permitting the crucible to rest substantially level on the cooling platform.

In an example, the orifice is configured to receive about 25% of a surface area of the bottom.

In an example, the orifice is circular.

In an example, the orifice is rectangular.

In an example, the first surface is separated from a second surface to define a rectangular cross section of the cooling duct.

In an example, the cooling duct further comprises a second surface configured to define a nozzle with the first surface, wherein the nozzle provides the portion of the forced air to the portion of the bottom of the directional solidification crucible received by the orifice.

In an example, the cooling duct is configured to provide the portion of the forced air substantially perpendicular to the portion of the bottom of the directional solidification crucible.

In an example, the cooling duct includes a cooling duct inlet configured to provide the cooling duct with the forced air.

In an example, the cooling duct inlet includes at least one forced air inlet configured to receive forced air from a fan.

In an example, the cooling duct is configured to provide the portion of the forced air in a substantially even pattern to the portion of the bottom of the directional solidification crucible.

In an example, the portion of the forced air that is provided to the portion of the bottom of the directional solidification crucible is turbulent.

In an example, a velocity of the portion of the forced air that is provided to the portion of the bottom of the directional solidification crucible is at least about 16 meters per second (m/s).

In an example, a cubic velocity of the portion of the forced air that is provided to the portion of the bottom of the directional solidification crucible is at least about 5000 cubic feet per minute.

In an example, the forced air received by the cooling duct inlet is about at ambient temperature.

In an example, the apparatus can include a top heater including at least one heating member, the heating member including a heating element or an induction heater.

In an example, the top heater further comprises insulation, the insulation including an insulating brick, a refractory, a mixture of refractories, an insulating board, a ceramic paper, a high temperature wool, or a mixture thereof.

In an example, the top heater further comprises an outer jacket, wherein the insulation is disposed at least partially between the heating element and the top heater outer jacket.

In an example, the top heater outer jacket includes stainless steel.

In an example, the directional solidification crucible further comprises an outer jacket, wherein the outer jacket defines the portion of the bottom of the directional solidification crucible that receives the portion of forced air.

In various embodiments, the present invention provides a method for directional solidification. The method includes providing or receiving a first silicon and providing or receiving a directional solidification crucible including a bottom. The method includes providing or receiving a cooling platform. The cooling platform includes a first surface defining an orifice configured to receive a portion of the bottom of the directional solidification crucible, and a cooling duct configured to provide forced air to the portion of the bottom of the directional solidification crucible. The method further includes cooling the portion of the directional solidification crucible with the forced air. The method includes directionally solidifying the first silicon in the directional solidification crucible to provide a second silicon.

In an example, the method further includes positioning a heater over the directional solidification crucible, including positioning a heating member selected from a heating element and an induction heater over the directional solidification crucible.

In an example, the receiving includes receiving the forced air from a fan.

In an example, the method further includes providing the forced air to the portion of the directional solidification crucible at a turbulent flow.

In an example, the method further includes providing the forced air perpendicular to the portion of the directional solidification crucible.

In an example, the method further includes substantially stopping the directionally solidifying the first silicon when about 80% of the first silicon is directly solidified to the second silicon, including stopping the cooling of the portion of the directional solidification crucible.

In an example, the method further includes adjusting a crystallization growth rate of the first silicon with the control of thermal profile of the directional solidification crucible or mould.

In an example, adjusting the crystallization growth rate includes adjusting the cooling of the portion of the directional solidification crucible.

In various embodiments, the present invention provides an apparatus for directional solidification. The apparatus includes a directional solidification crucible including a bottom. The apparatus further includes a cooling platform. The cooling platform further includes a first surface defining an orifice configured to receive a portion of the bottom of the directional solidification crucible. The bottom of the directional solidification crucible includes silicon carbide, graphite, or a combination thereof, and a plurality of veins configured to dissipate heat. The cooling platform further includes a cooling duct inlet below the first surface configured to receive forced air. The cooling duct inlet includes a cooling duct configured to turbulently provide the forced air to the portion of the bottom of the directional solidification crucible. The apparatus further includes a top heater, including a heating member, including a heating element or an induction heater, wherein the heating element includes silicon carbide, molybdenum disilicide, graphite, or a combination thereof.

The present invention provides advantages over previous apparatus and methods for directional solidification of silicon. In one example, the present invention can provide a more economically method of purifying silicon due to a more cost effect cooling apparatus. For example, the present invention can provide an economically more efficient method directionally solidifying silicon by using air as a cooling medium. Additionally, the top heater present in some embodiments of the present invention offers a convenient and efficient way to heat the silicon, maintain the temperature of the silicon, control the cooling rate of the silicon, or a combination thereof, which can allow precise control over the temperature gradient and the corresponding directional solidification of the silicon. Improved control of the directional solidification of silicon can result in a more pure product, a more consistent product, or combinations thereof. The apparatus and method of the present invention can be used to make silicon crystals for use in solar cells, among other things.

This summary is intended to provide an overview of subject matter of the present disclosure. It is not intended to provide an exclusive or exhaustive explanation of the invention. The detailed description is included to provide further information about the present disclosure.

DETAILED DESCRIPTION

Reference will now be made in detail to certain examples of the disclosed subject matter, some of which are illustrated in the accompanying drawings. While the disclosed subject matter will largely be described in conjunction with the accompanying drawings, it should be understood that such descriptions are not intended to limit the disclosed subject matter to those drawings. On the contrary, the disclosed subject matter is intended to cover all alternatives, modifications, and equivalents, which can be included within the scope of the presently disclosed subject matter, as defined by the claims.

References in the specification to "one embodiment", "an embodiment", "an example embodiment", etc., indicate that the embodiment described can include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

In this document, the terms "a" or "an" are used to include one or more than one and the term "or" is used to refer to a nonexclusive "or" unless otherwise indicated. In addition, it is to be understood that the phraseology or terminology employed herein, and not otherwise defined, is for the purpose of description only and not of limitation. Furthermore, all publications, patents, and patent documents referred to in this document are incorporated by reference herein in their entirety, as though individually incorporated by reference. In the event of inconsistent usages between this document and those documents so incorporated by reference, the usage in the incorporated reference should be considered supplementary to that of this document; for irreconcilable inconsistencies, the usage in this document controls.

In the methods of manufacturing described herein, the steps can be carried out in any order without departing from the principles of the invention, except when a temporal or operational sequence is explicitly recited. Furthermore, specified steps can be carried out concurrently unless explicit claim language recites that they be carried out separately. For example, a claimed step of doing X and a claimed step of doing Y can be conducted simultaneously within a single operation, and the resulting process will fall within the literal scope of the claimed process.

Furthermore, specified steps can be carried out concurrently unless explicit claim language recites that they be carried out separately. For example, a claimed step of doing X and a claimed step of doing Y can be conducted simultaneously within a single operation, and the resulting process will fall within the literal scope of the claimed process.

The present invention relates to an apparatus and method for directional solidification. The apparatus can advantageously be used for temperature gradient control during directional solidification of silicon. The apparatus and method of the present invention can be used to make silicon crystals for use in solar cells.

By controlling the temperature gradient in embodiments of the present invention, a highly controlled directional solidification can be accomplished. In the present invention, the directional crystallization proceeds approximately from bottom to top with more homogenous horizontal thermal field in the silicon, thus the desired temperature gradient has a lower temperature at the bottom and a higher temperature at the top. High degrees of control over the temperature gradient and the corresponding directional crystallization can advantageously allow a more effective directional solidification and better segregation, resulting in silicon of higher purity.

Definitions

The singular forms "a," "an" and "the" can include plural referents unless the context clearly dictates otherwise.

As used herein, in some examples, terms such as "first," "second," "third," and the like, as applied to other terms such as "mother liquor,", "crystals," "molten mixture," "mixture," "rinse solution," "molten silicon," and the like, are used simply as generic terms of differentiation between steps, and do not by themselves indicate priority of steps or order of steps, unless otherwise clearly indicated. For example, in some examples a "third mother liquor" may be an element, while no first or second mother liquor may be elements of the example. In other examples, a first, second, and third mother liquor may all be elements of an example.

As used herein, "conduit" can refer to a tube-shaped hole through a material, where the material is not necessarily tube-shaped. For example, a hole running through a block of material can be a conduit. The hole can be of greater length than diameter. A conduit can be formed by encasing a tube (including a pipe) in a material.

As used herein, "contacting" can refer to the act of touching, making contact, or of bringing substances into immediate proximity.

As used herein, "crucible" can refer to a container or mould that can hold molten material, such as a container that can hold material as it is melted to become molten, a container that can receive the molten material and maintain the material in its molten state, and a container that can hold molten material as it solidifies or crystallizes, or a combination thereof.

As used herein, "crystallization front" can refer to a solid-liquid interface.

As used herein, "directional solidification" or "directionally solidify" and the like can refer to crystallizing a material starting in approximately one location, proceeding in an approximately linear direction (e.g. vertically, horizontally, or perpendicular to a surface), and ending in approximately another location. As used in this definition, a location can be a point, a plane, or a curved plane, including a ring or bowl shape.

As used herein, "fan" can refer to any device or apparatus which can move air.

As used herein, "air" can refer to any mixture of air, water vapor or other gases.

As used herein, "flux" can refer to a compound that is added to a molten metal bath to aid in the removal of impurities, such as within a dross. A flux material can be added to the molten metal bath so that the flux material can react with one or more materials or compounds in the molten metal bath to form a slag that can be removed.

As used herein, "furnace" can refer to a machine, device, apparatus, or other structure that has a compartment for heating a material.

As used herein, "heating element" can refer to a piece of material which generates heat. In some examples, a heating element can generate heat when electricity is allowed to flow through that material.

As used herein, "induction heater" can refer to a heater which adds heat to a material via the inducement of electrical currents in that material or in the heater. The induction effect can be generated by allowing an alternating current to travel through a coil of metal that is proximate to the material.

As used herein, "ingot" can refer to a mass of cast material. In some examples, the shape of the material allows the ingot to be relatively easily transported. For example, metal heated past its melting point and solidified into a bar or block is referred to as an ingot.

As used herein, "lining" can refer to a layer of material applied to at least a portion of a surface of a crucible. The lining can act as a barrier between an inner surface of the crucible and a molten material contained within an interior of the crucible.

As used herein, "melt" or "melting" can refer to a substance changing from a solid to a liquid when exposed to sufficient heat. The term "melt" can also refer to a material that has undergone this phase transition to become a molten liquid.

As used herein, "molten" can refer to a substance that is melted, wherein melting is the process of heating a solid substance to a temperature (called the melting point) where it turns into a liquid.

As used herein, "monocrystalline silicon" can refer to silicon that has a single and continuous crystal lattice structure with almost no defects or impurities.

As used herein, "polycrystalline silicon" or "poly-Si" or "multicrystalline silicon" can refer to a material including multiple monocrystalline silicon crystals.

As used herein, "purifying" can refer to the physical segregation or chemical separation of a chemical substance of interest from foreign or contaminating substances.

As used herein, "refractory material" can refer to a material which is chemically and physically stable at high temperatures, particularly at high temperatures associated with melting and directionally solidifying silicon. Examples of refractory materials include but are not limited to aluminum oxide, silicon oxide, magnesium oxide, calcium oxide, zirconium oxide, chromium oxide, silicon carbide, graphite, or a combination thereof.

As used herein, "side" or "sides" can refer to one or more sides, and unless otherwise indicated refers to the side or sides or an object as contrasted with one or more tops or bottoms of the object.

As used herein, "silicon" can refer to the element having the chemical symbol Si, and can refer to Si in any degree of purity, but generally refers to silicon that is at least 50 wt % pure, 75 wt % pure, 85 wt % pure, 90 wt % pure, 95 wt % pure, or 99 wt % pure or more.

As used herein, "separating" can refer to the process of removing a substance from another (e.g., removing a solid or a liquid from a mixture). The process can employ any suitable technique known to those of skill in the art, e.g., decanting the mixture, skimming one or more liquids from the mixture, centrifuging the mixture, filtering the solids from the mixture, or a combination thereof.

As used herein, "tube" can refer to a hollow pipe-shaped material. A tube can have an internal shape that approximately matches its outer shape. The internal shape of a tube can be any suitable shape, including round, square, or a shape with any number of sides, including non-symmetrical shapes.

Crucible for Directional Solidification

FIG. 1 shows an example of a crucible 10 (e.g., crucible) according to the present disclosure. The crucible 10 can be used for directional solidification of silicon. For example, the crucible 10 can be used as a crucible for melting silicon within a furnace. In an example, material can be melted in a furnace prior to being poured into the crucible 10. The crucible 10 can also be used as the vessel in which directional solidification is carried out, also referred to as a directional solidification crucible. The crucible 10 can be formed from at least one refractory material 12 that is configured to provide for melting of silicon or directional solidification of molten silicon, or both.

The crucible 10 can have a bottom 14 and one or more sides 16 extending upwardly from the bottom 14. The crucible 10 can be shaped similar to a thick-walled large bowl, which can have a circular or generally circular cross-section. The crucible 10 can have other cross-sectional shapes, including, but not limited to, a square shape, or a hexagon, octagon, pentagon, or any suitable shape, with any suitable number of edges.

The bottom 14 and sides 16 define an interior of the crucible 10 that can receive a molten material, such as molten silicon 2. The interior can also receive a solid material, such as solid silicon (not shown), that can be melted to form the molten material. The refractory material 12 can include an inner surface 20 that faces the interior 18.

The refractory material 12 can be any suitable refractory material, particularly a refractory material that is suitable for a crucible for melting or directional solidification of silicon. Examples of materials that can be used as the refractory material 12 include, but are not limited to aluminum oxide ($Al_2O_3$, also referred to as alumina), silicon oxide (e.g., $SiO_2$, also referred to as silica), magnesium oxide (MgO, also referred to as magnesia), calcium oxide (CaO), zirconium oxide ($ZrO_2$, also referred to as zirconia), chromium (III) oxide ($Cr_2O_3$, also referred to as chromia), silicon carbide (SiC), graphite, or a combination thereof. The crucible 10 can include one refractory material, or more than one refractory material. The refractory material or materials that are included in the crucible 10 can be mixed, or they can be located in separate parts of the crucible 10, or a combination thereof. The one or more refractory materials 12 can be arranged in layers. The crucible 10 can include more than one layer of one or more refractory materials 12. The crucible 10 can include one layer of one or more refractory materials 12. The sides 16 of the crucible 10 can be formed from a different refractory material than the bottom 14. The sides 16 as compared to the bottom 14 of the crucible 10 can be different thicknesses, include different compositions of material, include different amounts of material, or a combination thereof. In an example, the sides 16 can include a hot face refractory, such as aluminum oxide. The bottom 14 of the crucible 10 can include a conducting (e.g., heat-conductive) material, such as, for example, silicon carbide, graphite, steel, stainless steel, cast iron, copper, or a combination thereof. In an example, the sides 16 include an aluminum oxide (alumina) refractory material, and the bottom 14 includes a silicon carbide refractory with a phosphorus binder.

Impurities can be passed from the refractory material 12 to the molten silicon 2 such that the impurity levels of some impurities can be higher than is acceptable for use of the silicon in photovoltaic devices. This can be particularly problematic during the directional solidification stages of purifying silicon, because directional solidification can be one of the final purification steps for the silicon such that the silicon in the crucible being used for directional solidification, such as crucible 10, is some of the purest silicon in the entire process. For example, boron, iron, carbon, or phosphorus impurities can be present in the refractory material 12. Even at very small boron, iron, or phosphorus levels, at the high temperatures experienced by the refractory material 12 due to the proximity and temperature of the molten silicon 2, the boron, iron, or phosphorus can be driven to diffuse out of the refractory material 12 and into the molten silicon 2. Also, if the refractory material 12 is made from or contains alumina ($Al_2O_3$), the alumina can undergo a reduction reaction in the presence of the molten silicon 2 to form metallic aluminum (Al) that can contaminate the molten silicon 2.

The lining 30 can be configured to prevent or reduce contamination of the molten silicon 2, such as via the transfer of impurities, such as boron (B), phosphorus (P), iron (Fe), carbon (C), and aluminum (Al) from the refractory material 12 of the crucible 10 into the molten silicon 2, or via reaction an impurity or contaminant from the refractory material 12 into the molten silicon 2. The lining 30 can provide a barrier to the contaminants or impurities that can be present within the refractory material 12.

In an example, the crucible 10 can include an outer jacket 22. The outer jacket 22 can include any suitable material to enclose the insulating layer and the directional solidification crucible. The outer jacket 22 can include one or more materials. In one embodiment, the outer jacket 22 includes steel. In another embodiment, the outer jacket 22 includes steel, stainless steel, copper, cast iron, a refractory material, a mixture of refractory materials, or a combination thereof. Different portions of the outer jacket 22 can include different materials, different thicknesses of materials, different compositions of materials, or a combination thereof. The outer jacket 22 can encompass the bottom 14 or sides 16 of the crucible 10. In an example, the outer jacket 22 defines a portion of the bottom not covered by the jacket 22 (e.g., FIG. 2, 214), so as to increase the dissipation of heat in that portion. In such an example, the outer jacket 22 can insulate the sides 16 but not a portion of the bottom 14.

In an example, the crucible 10 can hold about 1 metric tonne of molten silicon, or more. In an example, the crucible can hold about 1.4 metric tonnes of molten silicon, or more. In an example, the crucible can hold about 2.1 metric tonnes of molten silicon, or more. In an example, the crucible can hold at least about 1, 1.2, 1.4, 1.6, 1.8, 2.0, 2.1, 2.5, 3, 3.5, 4, 4.5, or 5 metric tonnes of silicon molten, or more.

Directional Solidification Apparatus

Figure 2:
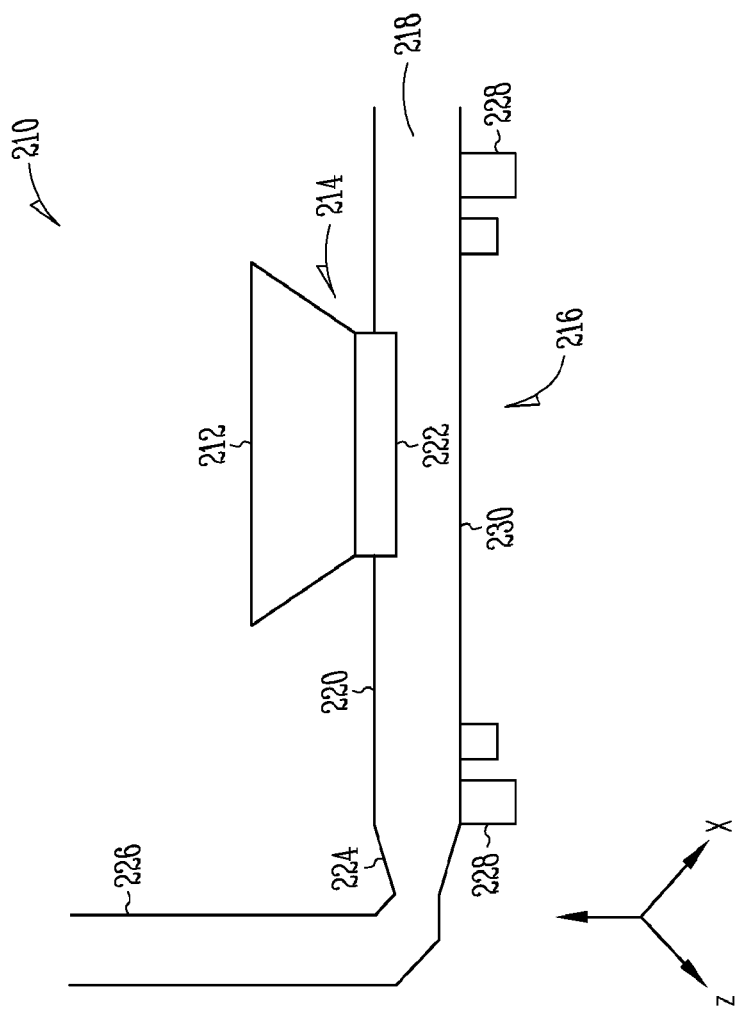
FIG. 2 illustrates a prospective view of an apparatus for directional solidification of silicon, as constructed in accordance with at least one embodiment.

FIG. 2 shows an example of a directional solidification apparatus 210 according to the present disclosure. The apparatus 210 can be used for directional solidification of silicon or any other material. The apparatus 210 can include a crucible 210, such as crucible 10 of FIG. 1, as described herein. The crucible 210 can rest on top of or be positioned above a cooling platform 216. The cooling platform 216 can include a number of different construction materials, including metal such as stainless steel, concrete, rebar, etc.

The cooling platform 216 can include a first surface 220 that defines an orifice 222. The orifice 222 can include reinforcing material, so as to be able to withstand at least a portion of the weight of the crucible 212. The orifice 222 can be configured to receive a portion 214 of the bottom of the directional solidification crucible 210 in the center, so as to be exposed to a cooling duct 218. The bottom portion 214 can include a convex outer surface of the crucible 210, such that the bottom portion 214 can sit in the orifice 222 or reside below the first surface 220. In an example, the orifice 222 can receive about 25% of surface in contact with the molten silicon surface area of the bottom. The bottom portion 214 can include substantially a center of the bottom of the directional solidification crucible 212. For example, a center of the bottom can include a portion of the bottom such that a longitudinal center or latitudinal center of the bottom of the directional solidification crucible 212 is received by the orifice 214. In an example, the portion 214 of the bottom of the directional solidification crucible 212 can be received such that the crucible can rest substantially level on the cooling platform 216. Substantially level can include the top of the directional solidification crucible 212 being level from front to back or side to side. In an example, level can include a molten silicon surface being level or a crystallization front being level. The orifice 222 can be any shape, including circular, rectangular, hexagonal, or the like.

The cooling duct 218 can be defined by a first surface 220 separated from a second surface 230, so as to define a passage or conduit for a fluid, such as air or mixture of air and water vapor or other gases. In an example, the cooling platform 210 can include a number of support legs 228 to position or support the cooling duct 218. The cooling duct 218 can include a circular cross section, a rectangular cross section, or any other cross section suitable for conveying a fluid. In an example, the second surface 230 can be configured in relation to the first surface 220 so as to define a nozzle that provides the portion of the forced air flow or mixture of air and water vapor or other gases to the portion 214 of the bottom of the directional solidification crucible 212. The cooling duct 218 can be configured so as to provide the portion of the forced air flow or mixture of air and water vapor or other gases substantially perpendicular, in the Y-direction, to the portion 214 of the bottom of the directional solidification crucible 212. Such an example can provide improved temperature control, improved heat dissipation, among other things. In an example, the cooling duct 218 can be configured to provide the portion of the forced air flow or mixture of air and water vapor or other gases in a substantially even pattern to the portion 214 of the bottom of the directional solidification 212. The pattern can include an air flow or mixture of air and a water vapor or other gases pattern such that there are few to no areas of the portion 214 that receive substantially more or less flow than others. For example, the cooling platform 210 can be designed so that a homogenous field of flow velocity in the Y-direction contacts the bottom of the mould 214.

The cooling duct 218 can include a cooling duct inlet 224 configured to receive forced air from a fan. Air can include any gas, such as ambient air or mixture of air and a water vapor or other gases, with a specific heat capacity suitable to provide a medium for heat dissipation from the crucible. In an example, a fan can push air through a conduit 226 to be received by the cooling duct inlet 224. One or more fans can provide forced air through one or more conduits such as 226 to the cooling duct inlet 224.

In an example, the portion of the forced air or mixture of air and a water vapor or other gases provided to the portion

214 of the bottom of the directional solidification crucible 212 can be turbulent. For example, the portion of the forced air or mixture of air and a water vapor or other gases can have a Reynolds number (Re) of about 4000 or greater. The portion of the forced air provided to the portion 214 of the bottom of the directional solidification crucible 212 can have an average velocity in y-direction of at least about 16 m/s.

Figure 3:
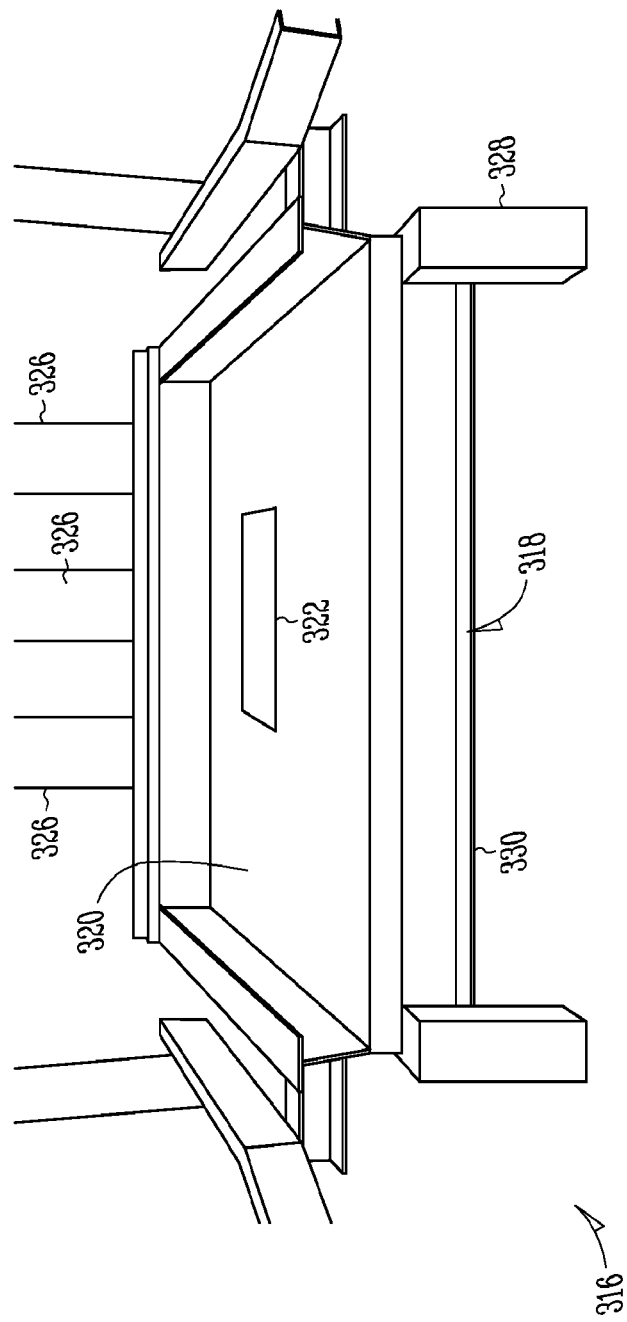
FIG. 3 illustrates an example of a cooling platform for directional solidification of silicon, as constructed in accordance with at least one embodiment.

FIG. 3 shows an example of a cooling platform 316. Cooling platform 316 can include a first surface 320 configured to define an orifice 322, as described herein. The cooling duct 318, including the first surface 322 and the second surface 330, can be supported by the support legs 328. As shown, cooling platform 316 can include three conduits 226, but embodiments are not so limited. Each conduit 226 can be supplied by a fan pushing forced air or mixture of air and a water vapor or other gases. The conduits 226 can provide forced air or mixture of air and a water vapor or other gases to a cooling duct inlet, which can provide forced air or mixture of air and a water vapor or other gases to the cooling duct 318.

General

Figure 4:
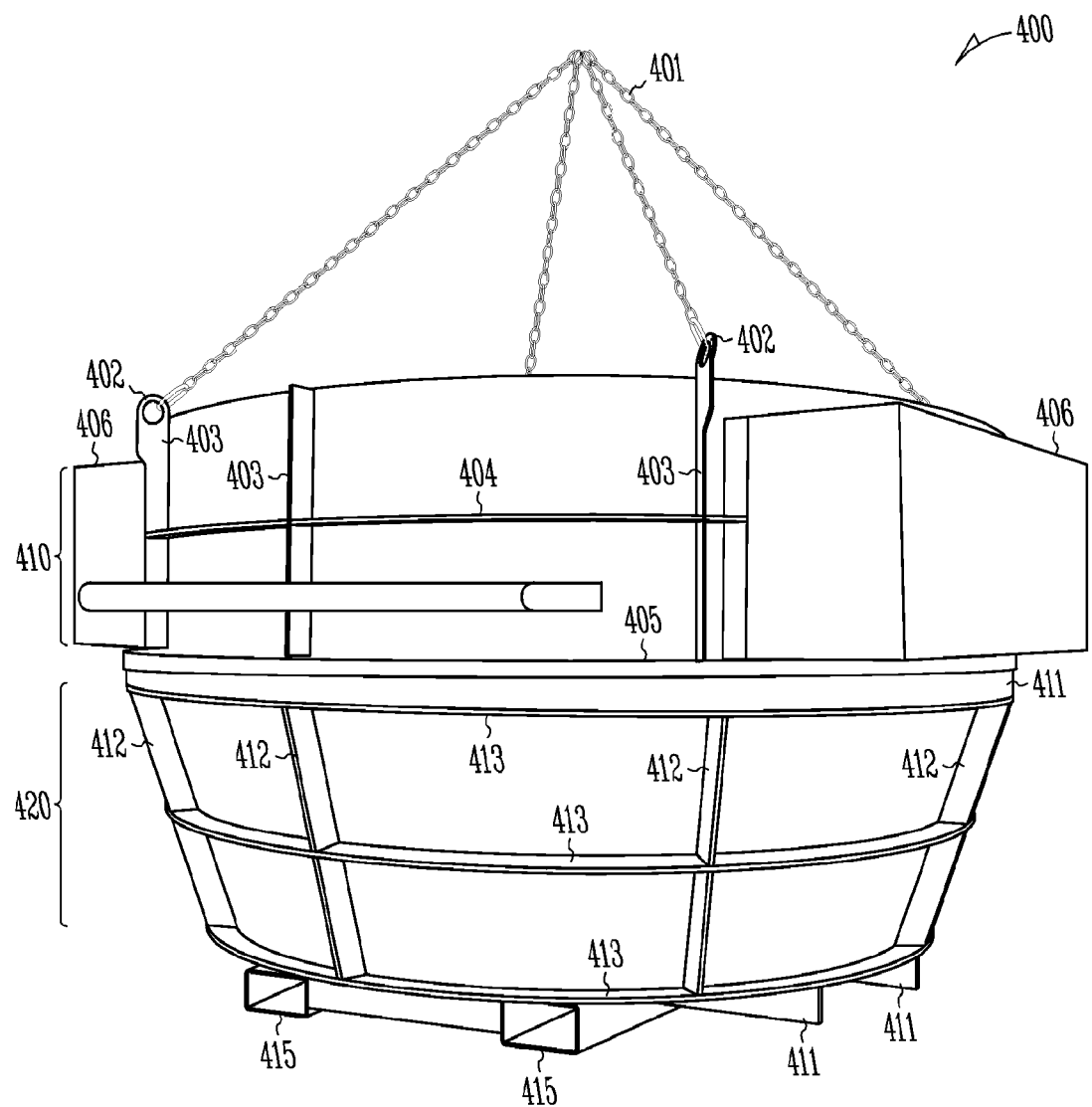
FIG. 4 illustrates a 3D projection of an apparatus for directional solidification of silicon, including a heater positioned on top of a crucible, as constructed in accordance with at least one embodiment.

FIG. 4 illustrates a specific embodiment of an apparatus 400 for directional solidification of silicon, including a top heater part positioned on top of a bottom crucible 420. The top heater includes chains 401 which are connected to the top heater 410 via holes 402 in vertical structural members 403. The chains 401 form a bridle, which can allow the top heater to be moved by the use of a crane. The apparatus can also be moved, for example, by placing the bottom half of the apparatus on a scissor lift while leaving the top heater over the bottom half. The apparatus can be moved in any suitable fashion. In an example the apparatus can be moved by hydraulic or mechanic systems assisted by regulation. The vertical structural members 403 extend vertically from the bottom edge of the outer jacket of the top heater 410 to the top edge of the stainless steel outer jacket of the top heater 410. The vertical structural members are located on the outside of the top heater outer jacket and extend from the jacket parallel to a direction that is away from the center of the top heater. The top heater also includes a horizontal structural member 404, which is located on the outside of the top heater outer jacket and extends from the jacket in a direction that is parallel to a direction that is away from the center of the top heater. The top heater also includes a lip 405 that is part of the outer jacket of the top heater. The lip protrudes away from the outer jacket of the top heater. The lip can extend inward toward the center axis of the top heater such that it covers insulation of the top heater to any suitable extent. Alternatively, the lip can extend inward only enough to cover the bottom edge of the outer jacket of the top heater. Screen boxes 406 enclose ends of the heating members that protrude from the outer jacket of the top heater, protecting users from the heat and electricity that can be present in and near the ends of these members.

In the specific embodiment depicted in FIG. 4, insulation 411 from the bottom crucible 420 is between the top heater 410 and the bottom crucible 420. At least part of the one or more insulating layers of the bottom crucible extends above the height of the outer jacket of the bottom crucible. The bottom crucible includes vertical structural members 412. The vertical structural members 412 are on the outer surface of the outer jacket of the bottom crucible, extending away from the outer jacket parallel to a direction that is away from the center of the bottom crucible. The vertical structural members 412 extend vertically from the bottom edge of the outer jacket to the top edge of the outer jacket. The bottom crucible also includes horizontal structural members 413. The horizontal structural members 413 are on the outer surface of the outer jacket of the bottom crucible, extending away from the outer jacket parallel to a direction that is away from the center of the bottom crucible. The horizontal structural members 413 extend horizontally around the circumference of the bottom crucible. The bottom crucible also includes bottom structural members 414 and 415. The bottom structural members 414 and 415 extend away from the outer jacket parallel to a direction that is away from the center of the bottom crucible. The bottom structural members extend across the bottom of the bottom crucible. Some of the bottom structural members 415 are shaped such that they allow a forklift or other machine to lift or otherwise physically manipulate the apparatus.

Bottom of Directional Solidification Crucible

Figure 5:
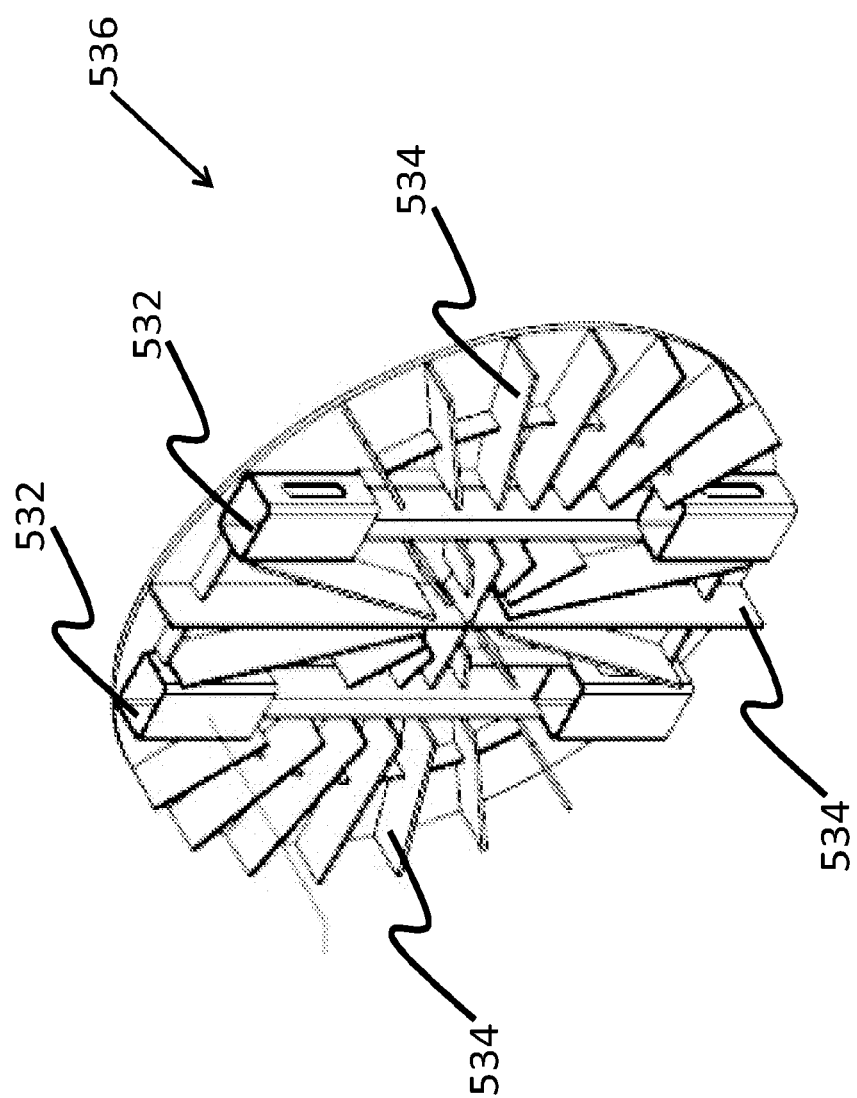
FIG. 5 illustrates an isometric view of bottom of an apparatus for directional solidification of silicon, as constructed in accordance with at least one embodiment.

FIG. 5 shows an embodiment of a bottom 536 of a directional solidification crucible according to the present disclosure. The bottom 536 can be included in a crucible, such as crucible 10 or 210, as described herein. The bottom 536 can include structural members 532 that extend partially across the bottom 536. Structural members 532 can include strips, bars, tubes, or any suitable structure for adding structural support to the apparatus. A structural member 532 can be attached to an outer jacket 22 of a crucible 10 via welding, brazing, or any other suitable method. In an example where the outer jacket 10 does not cover a portion of the bottom, as described in relation to FIG. 1, the structural members can be attached directly to the bottom of the crucible 14 or to some other support material attached to the refractory 12. The structural members 532 can be adapted to facilitate transportation and physical manipulation of the apparatus. For example, the structural members 532 can be tubes of sufficient size, strength, orientation, spacing, or a combination thereof, such that a particular fork-lift or other lifting machine could lift or move or otherwise physically manipulate the apparatus.

The bottom 536 can include a plurality of heat transfer fins 534 attached to the bottom of the crucible 14 or outer jacket to facilitate air cooling or dissipation of heat. The heat transfer fins can extend outwardly along the bottom 536. Fans can enhance the cooling effect of cooling fins by blowing across the bottom 536. Any suitable number of fins can be used. The plurality of fins 534 can absorb heat from the bottom of the apparatus and allow the heat to be removed by air or mixture of air and a water vapor or other gases, facilitated by the surface area of the fin. For example, the fins can be made of flat bar, such as copper, cast iron, steel, or stainless steel.

Top Heater

In various embodiments, a top heater can also be included and positioned on top of the crucible, such as the crucibles 10, 212, 420 described above, to apply heat to the molten silicon within the crucible during a directional solidification. The top heater can have a cross-sectional shape that approximately matches the cross-sectional shape of the crucible. Application of heat to the crucible by the top heater can allow for control of the temperature of the molten silicon in the crucible. The top heater can also be positioned on top of the crucible without heating, so that the top heater can serve as an insulator to control the release of heat from the crucible. By controlling the temperature or release of heat of the crucible, a desired temperature gradient can be provided, which can allow for more highly controlled directional solidification. Ultimately, control over the temperature gradient can allow a more effective directional solidification in which the resulting purity of the silicon is maximized.

Figure 6:
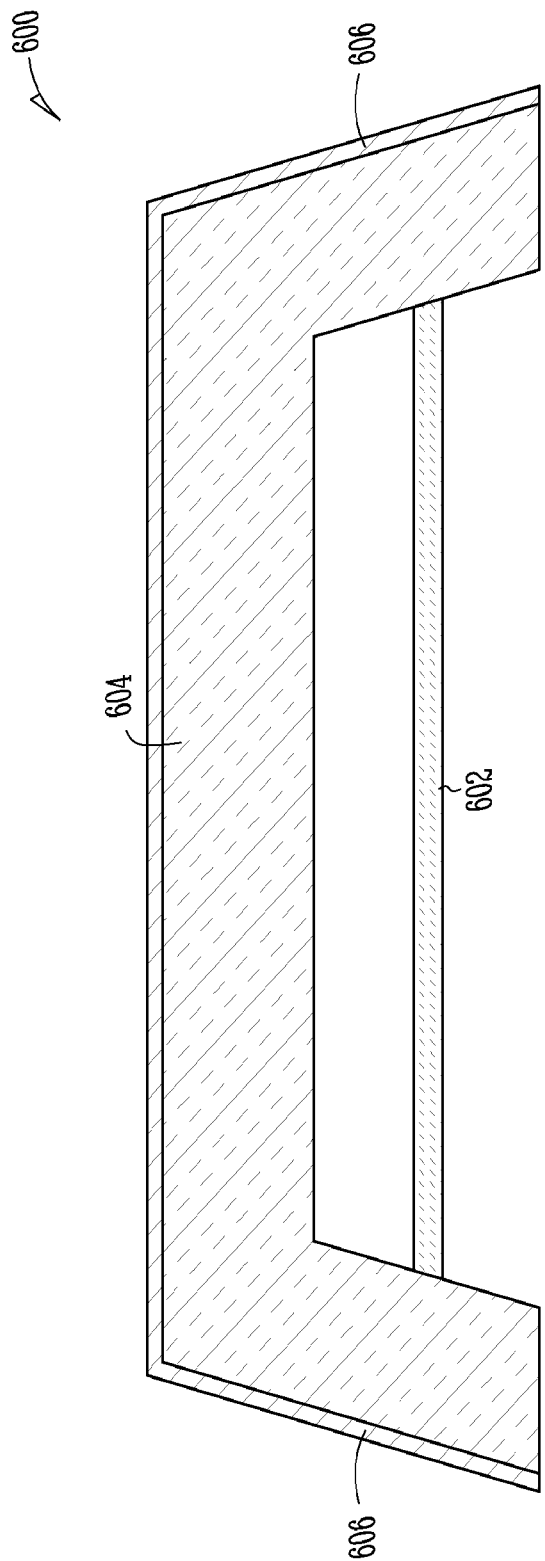
FIG. 6 is a cross-sectional view of an example top heater that can be used for directional solidification of silicon, as constructed in accordance with at least one embodiment.

FIG. 6 shows an example of a top heater 600. The top heater 600 can include one or more heating members 602. Each of the one or more heating members 602 can independently include any suitable material. For example, each of the one or more heating members 602 can independently include a heating element, where the heating element can include silicon carbide, molybdenum disilicide, graphite, copper, or a combination thereof; and, each of the one or more heating members 602 can alternatively independently include an induction heater. In an example, the one or more heating members are positioned at approximately the same height. In another example, the one or more heating members are positioned at different heights.

In an example, the heating members 602 can include silicon carbide, which can have certain advantages. For example, silicon carbide heating members 602 can be less likely to corrode at high temperatures in the presence of oxygen. Oxygen corrosion can be reduced for heating elements including corrodible materials by using a vacuum chamber, but silicon carbide heating members 602 can avoid corrosion without a vacuum chamber. Additionally, silicon carbide heating members 602 can be used without water-cooled leads. In an example, the heating elements are used in a vacuum chamber, with water-cooled leads, or both. In an example, the heating members 602 are used without a vacuum chamber, without water-cooled leads, or without both.

In an example, the one or more heating members 602 are induction heaters. The induction heaters 602 can be cast into one or more refractory materials. The refractory material containing the induction heating coil or coils can then be positioned over the bottom crucible. The refractory material can be any suitable material, including, but not limited to aluminum oxide, silicon oxide, magnesium oxide, calcium oxide, zirconium oxide, chromium oxide, silicon carbide, graphite, or a combination thereof. In another example, the induction heaters 602 are not cast into one or more refractory materials.

The one or more heating members 602 can have an electrical system such that if at least one heating member 602 fails, any remaining functional heating members 602 can continue to receive electricity and to produce heat. In an example, each heating member 602 has its own circuit.

The top heater 600 can include insulation 604. The insulation 604 can include any suitable insulating material, including, but not limited to, insulating brick, a refractory, a mixture of refractories, insulating board, ceramic paper, high temperature wool, or a mixture thereof. Insulating board can include high temperature ceramic board. A bottom edge of the insulating material 604 and the one or more heating members 602 can be at approximately the same height, or the heating members 102 can be positioned above the height of the bottom edge of the insulating material 604, or the bottom edge of the insulating material 604 can be positioned above the height of the heating members 602. Other configurations of the one or more heating members 602 and the insulating material 604 can be used, such as the one or more heating members 602 being an induction heater, the insulating material 604 including a refractory material, wherein the one or more heating members 602 are encased in the refractory material 604. In such an example, additional insulating material can also be optionally included, where the additional insulating material can be refractory material, or the additional insulating material can be another suitable insulating material.

The top heater 600 can include an outer jacket 606. The outer jacket 606 can include any suitable material, including, but not limited to steel, stainless steel, copper, cast iron, a refractory material, a mixture of refractory materials, or a combination thereof. The insulating material 604 can be disposed at least partially between the one or more heating members 602 and the outer jacket 606. The bottom edge of the outer jacket 606 can be approximately even with the bottom edge of the insulating material 604 and with the one or more heating members 602, or the bottom edge of the outer jacket 606 can be offset from the bottom edge of the insulating material 604 or with the one or more heating members 602, or both. In an example, a portion of the outer jacket 606 that covers an edge of the insulating material 604 can include a material with a relatively low conductivity, such as a suitable refractory, such as aluminum oxide, silicon oxide, magnesium oxide, calcium oxide, zirconium oxide, chromium oxide, silicon carbide, graphite, or a combination thereof.

The top heater outer jacket 606 can include structural members, such as members that can add strength or rigidity to the top heater 600. The structural members can include steel, stainless steel, copper, cast iron, a refractory material, a mixture of refractory materials, or a combination thereof. In an example, the top heater outer jacket 606 can include one or more structural members that extend from outside of the top heater outer jacket 606 in a direction that is away from a center of the top heater 600, and that extend horizontally around the circumference or perimeter of the top heater 600. The one or more horizontal structural members can be located, for example, at a lower edge of the outside of the top heater outer jacket 606, at the top edge of the outside of the top heater outer jacket 606, or at any position in between the bottom and top edges of the outside of the top heater outer jacket 606. In an example, the top heater 600 includes three horizontal structural members, with one located at the bottom edge of the top heater outer jacket 606, one located at the upper edge of the top heater outer jacket 606, and one located in-between the lower and upper edges of the top heater outer jacket 606.

The top heater outer jacket 606 can include one or more structural members on the outside of the top heater outer jacket 606 that extend for outside of the top heater outer jacket 606 in a direction that is away from the center of the top heater 600 vertically from the bottom of the outside of the top heater outer jacket 606 to the top of the outside of the top heater outer jacket 606. In an example, the top heater outer jacket 606 can include eight vertical structural members. The vertical structural members can be evenly spaced around the circumference or perimeter of the top heater 600. In an example, the top heater outer jacket 606 can include both vertical and horizontal structural members. The top heater outer jacket 606 can include structural members that extend across the top of the top heater outer jacket 606. The structural member on the top can extend from one outer edge of the top of the top heater outer jacket 606 to another edge of the top of the top heater outer jacket 606. The structural members on the top can also extend partially across the top of the outer jacket 606. The structural members can be strips, bars, tubes, or any suitable structure for adding structural support to the top heater. The structural members can be attached to the top heater outer jacket 606 via welding, brazing, or other suitable method. The structural members can be adapted to facilitate transportation and physical manipulation of the apparatus. For example, the structural members on the top of the outside of the top heater outer jacket 606 can be tubes of sufficient size, strength, orientation, spacing, or a combination thereof, such that a particular fork-lift or other lifting machine could lift or move or otherwise physically manipulate the top heater. In another example, the structural members described above as being located on the outside of the top heater outer jacket 606 can alternatively or additionally be located on the inside of the top heater outer jacket 606. In another example, the top heater 600 can be moved using a crane or other lifting device, such as a hydraulic device, using chains attached to the top heater 600, including chains attached to structural members of the top heater or to non-structural members of the top heater 600. For example, chains can be attached to the upper edge of the top heater outer jacket 606 to form a bridle for a crane to lift and otherwise move the top heater 600.

Method of Directional Solidification

The present invention provides a method of directional solidification using the apparatus described above, where the apparatus can be any embodiment of the apparatus. The method of directional solidification can include purifying silicon to make one or more silicon ingots for cutting into one or more solar wafers. The method includes providing or receiving a first silicon. The first silicon can include silicon of any suitable grade of purity. The method can include at least partially melting the first silicon. The method can include fully melting the first silicon. At least partially melting the first silicon can include completely melting the first silicon, almost completely melting the first silicon (over about either 99%, 95%, 90%, 85%, or 80% melted by weight), or partially melting the first silicon (less than about 80% or less melted by weight). Melting the first silicon provides a first molten silicon. The method includes providing or receiving a directional solidification crucible including a bottom. The directional solidification crucible can be substantially similar to that described herein.

The method can include providing or receiving a cooling platform. The cooling platform can be substantially similar that that described herein. The method can include cooling the portion of the directional solidification crucible with the forced air or mixture of air and a water vapor or other gases. The portion can include a portion encased by an outer jacket or refractory material of an exposed bottom of the crucible, as described herein.

The method includes directionally solidifying the first silicon, to provide a first molten silicon. In the directional solidification, the silicon solidifies approximately starting at the bottom of the directional solidification crucible, and approximately ending at the top of the directional solidification crucible. The directional solidification provides a second silicon. The last-to-freeze portion of the second silicon includes a greater concentration of impurities than the first silicon. The portions of the second silicon other than the last-to-freeze portion include a lower concentration of impurities than the first silicon.

The second silicon can be a silicon ingot. The silicon ingot can suitable for cutting into solar wafers, for the manufacture of solar cells. The silicon ingot can be cut into solar wafer using, for example, a band saw, a wire saw, or any suitable cutting device.

In some embodiments, the method is performed in a vacuum, in an inert atmosphere, or in ambient air. To perform the method in a vacuum or in an inert atmosphere, the apparatus can be placed in a chamber that is capable of being made a less than atmospheric pressure or of being filling with an atmosphere with a greater concentration of inert gasses than ambient air. In an example the space between the crucible and top heater can be in a vacuum or in an inert atmosphere. In some embodiments, argon can be pumped into the apparatus or into a chamber holding the apparatus, to displace oxygen from the apparatus. Carbon from the heating elements can be removed from the apparatus.

In some embodiments, the method includes positioning the top heater described above over the directional solidification crucible. The bottom crucible, including the directional solidification crucible, can be preheated before molten silicon is added. The top heater can be used to preheat the bottom crucible. Preheating the bottom crucible can help to prevent excessive quick solidification of silicon on the walls of the crucible. The top heater can be preheated before molten silicon is added. The top heater can be used to melt the first silicon. The top heater can be used to transfer heat to the silicon, after it is melted. The top heater can transfer heat to the silicon after it is melted when the silicon is melted in the directional solidification crucible. The top heater can be used to control the heat of the top of the silicon. The top heater can be used as an insulator, to control the amount of heat loss at the top of the bottom crucible. The first silicon can be melted outside the directional solidification crucible, such as in a furnace, and then added to the directional solidification crucible. In some embodiments, silicon that is melted outside the directional solidification crucible can be further heated to a desired temperature using the top heater after being added to the directional solidification crucible.

In embodiments including a top heater including an induction heater, the silicon will preferably be melted prior to being added to the bottom crucible. Alternatively, the top heater will include heating elements as well as induction heaters. Induction heating can be more effective with molten silicon. Induction can cause mixing of the molten silicon. In some embodiments, the power can be adjusted sufficiently to optimize the amount of mixing, as too much mixing can improve segregation of impurities. To produce a silicon feedstock the turbulent mixing can improve the quality of silicon, but can also create undesirable effects, like porosity or precipitation of impurities in the final silicon ingot. The nature and intensity of stirring should not create hydrodynamic instability in the silicon liquid and destabilize the front of solidification.

The directional solidification can include the removal of heat from the bottom of the directional solidification crucible. The removal of heat can occur in any suitable fashion. For example, the removal of heat can include blowing fans across the bottom of the directional solidification crucible. The removal of heat can include allowing ambient air or mixture of air and a water vapor or other gases to cool the bottom of the crucible, without the use of fans. The removal of heat can include, in addition to ambient air or mixture of air and a water vapor or other gases, running a cooling liquid through tubes adjacent to the bottom of the directional solidification crucible, though tubes that run through the bottom of the directional solidification crucible, through tubes that run through a material on which the directional solidification crucible sits, or a combination thereof. Removal of heat from the bottom of the directional solidification crucible allows a thermal gradient to be established in the directional solidification crucible that causes directional solidification of the molten silicon therein approximately from the bottom of the directional solidification crucible to the top of the crucible.

Removal of heat from the bottom of the directional solidification crucible can be performed for the entire duration of the directional solidification. Multiple cooling methods can be used. For example, the bottom of the directional solidification crucible can be liquid cooled and cooled with fans. Fan cooling can occur for part of the directional solidification, and liquid cooling for another, with any suitable amount of overlap or lack thereof between the two cooling methods. Cooling with liquid can occur for part of the directional solidification, and ambient air or mixture of air and a water vapor or other gases cooling alone for another part, with any suitable amount of overlap or lack thereof between the two cooling methods. Cooling by setting the directional solidification crucible on a cooled block of material can also occur for any suitable duration of the directional solidification, including in any suitable combination with other cooling methods with any suitable amount of overlap. Cooling of the bottom can be performed while heat is being added to the top; for example, while heat is added to the top to increase the temperature of the top, to maintain the temperature of the top, or to allow a particular rate of cooling of the top. All suitable configurations and methods of heating the top of the directional solidification crucible, cooling the bottom, and combinations thereof, with any suitable amount of temporal overlap or lack thereof, are encompassed as embodiments of the present invention.

The directional solidification can include using the top heater to heat the silicon to at least about 1450° C., 1460° C., or 1470° C., and slowly cooling the temperature of the top of the silicon from approximately 1450° C., 1460° C., or 1470° C. to 1410° C. over approximately 18 to 26 hours. The directional solidification can include using the top heater to heat the silicon to at least about 1450° C., and holding the temperature of the top of the silicon approximately constant at between approximately 1450 and 1460° C. for approximately 16 hours, depending on the weight and height of the ingot. The directional solidification can include turning off the top heater, allowing the silicon to cool for approximately 4-8 hours, and then removing the top heater from the directional solidification crucible.

In one embodiment, the directional solidification includes using the top heater to heat the silicon to at least about 1450° C., and holding the temperature of the top of the silicon approximately constant at between approximately 1440 and 1460° C. for approximately 16 to 24 hours, depending on the weight and height of the ingot. The embodiment includes turning off the top heater, allowing the silicon to cool for approximately 4-8 hours, and then removing the top heater from the directional solidification crucible.

In another embodiment, the directional solidification includes using the top heater to heat the silicon to at least about 1450° C., 1460° C., or 1470° C., and slowly cooling the temperature of the top of the silicon from approximately 1450 to 1410° C. over approximately 10 to 16 hours. The embodiment includes turning off the top heater, allowing the silicon to cool for approximately 4-12 hours, and then removing the top heater from the directional solidification crucible.

In another embodiment, directional solidification can include using the top heater to heat the silicon with a power control of at least about 60, 70 or 80% of the total power generated by the electric generator to get at least about 1450° C., 1460° C., or 1470° C. The power can be held approximately constant at between about 60, 70 or 80% power for approximately 10 to 16 hours. Power to the top heater can be turned off and the silicon can be allowed to cool for approximately 4-12 hours, after which time the top heater can be removed from the directional solidification crucible.

In another embodiment, directional solidification can include using the top heater to heat the silicon with a power control at least about 60, 70 or 80% of total power generated by the electric generator to get at least about 1450° C., 1460° C., or 1470° C. The temperature of the top of the silicon is permitted to cool from approximately 1450 to 1410° C. over approximately 10 to 16 hours. The top heater can be turned off for the silicon to cool for approximately 4-12 hours, after which time the top heater can be removed from the directional solidification crucible.

The method can include removing the second silicon from the directional solidification crucible. The silicon can be removed by any suitable method. For example, the silicon can be removed by inverting the directional solidification crucible and allowing the second silicon to drop out of the directional solidification crucible. In another example, the directional solidification crucible is parted down the middle to form two halves, allowing the second silicon to be easily removed from the crucible.

The method can include removing the last silicon liquid. During solidification the liquid is saturated with impurities by segregation, the last silicon liquid can be removed to another container from the directional solidification crucible. The second silicon can be easily removed from the crucible or mould after solidification. This method can improve the quality of the ingot and the production cost.

The method can include removing any suitable section from the directionally solidified second silicon. Preferably, the removal of the suitable section leads to an increase in the overall purity of the silicon ingot. For example, the method can include removing from the directionally solidified second silicon at least part of the last-to-freeze section. Preferably, the last-to-freeze section of the directionally solidified silicon is the top of the ingot, as it is oriented during the bottom-to-top directional solidification. By segregation the greatest concentration of impurities generally occurs in the last-to-freeze section of the solidified silicon. Removing the last-to-freeze section thus can remove impurities from the solidified silicon, resulting in a trimmed-second silicon with a lower concentration of impurities than the first silicon. The removal of a section of the silicon can include cutting the solid silicon with a band saw. The removal of a section of the silicon can include shot blasting or etching. Shot blasting or etching can also be used generally to clean or remove any outer surface of the second silicon, not just the last-to-freeze portion.

The method can include purifying silicon from a silicon-aluminum complex using a cascading dissolving solution and washing process. The dissolving solution can include acid solution. The dissolving solution can react with or dissolve impurities in the silicon, including aluminum. The method includes combining a first silicon-aluminum complex with a weak dissolving solution. The combination is performed sufficiently to allow the first complex to react at least partially with the weak dissolving solution. The combination provides a first mixture. The method also includes separating the first mixture. The separation of the first mixture provides a third silicon-aluminum complex and the weak dissolving solution. The method also includes combining the third silicon-aluminum complex with a strong dissolving solution. The combination is performed sufficiently to allow the third complex to react at least partially with the strong dissolving solution. The combination provides a third mixture. The method also includes separating the third mixture. The separation provides a first silicon and the strong dissolving solution. The method also includes combining the first silicon with a first rinse solution. The combination provides a fourth mixture. The method also includes separating the fourth mixture. The separation of the fourth mixture provides a wet purified silicon and the first rinse solution. The method also includes drying the wet purified silicon. The drying of the wet purified silicon provides a dry purified silicon.

Additional Embodiments

The present invention provides for the following exemplary embodiments, the numbering of which is not to be construed as designating levels of importance:

Embodiment 1 provides an apparatus for directional solidification, including a directional solidification crucible including a bottom, and a cooling platform, including a first surface defining an orifice configured to receive a portion of the bottom of the directional solidification crucible; and a cooling duct configured to provide a portion of forced air to the portion of the bottom of the directional solidification crucible.

Embodiment 2. The apparatus of embodiment 1, wherein a plurality of side walls of the directional solidification crucible include a hot face refractory.

Embodiment 3. The apparatus of any one of embodiments 1 or 2, wherein the bottom of the directional solidification crucible includes a conducting refractory.

Embodiment 4. The apparatus of any one of embodiments 1-3, wherein the portion of the bottom of the directional solidification crucible dissipates heat at a rate of about 10% per hour with the forced air.

Embodiment 5. The apparatus of any one of embodiments 1-4, wherein at least the portion of the bottom of the directional solidification crucible includes a plurality of heat transfer fins configured to dissipate heat.

Embodiment 6. The apparatus of embodiment 5, wherein at least a portion of the plurality of heat transfer fins extend outwardly along the bottom of the directional solidification crucible.

Embodiment 7. The apparatus of embodiment 5 or 6, wherein the heat transfer fins include flat bar.

Embodiment 8. The apparatus of any one of embodiments 5-7, wherein the heat transfer fins include stainless steel.

Embodiment 9. The apparatus of any one of embodiments 1-8, wherein at least the portion of the bottom of the directional solidification crucible includes a convex surface configured to sit within the orifice.

Embodiment 10. The apparatus of any one of embodiments 1-9, wherein the orifice receives substantially a center of the bottom of the directional solidification crucible.

Embodiment 11. The apparatus of any one of embodiments 1-10, wherein the orifice is configured to receive the portion of the bottom of the directional solidification crucible by permitting the crucible to rest substantially level on the cooling platform.

Embodiment 12. The apparatus of any one of embodiments 1-11, wherein the orifice is configured to receive about 25% of a surface area of the bottom.

Embodiment 13. The apparatus of any one of embodiments 1-12, wherein the orifice is circular.

Embodiment 14. The apparatus of any one of embodiments 1-12, wherein the orifice is rectangular.

Embodiment 15. The apparatus of any one of embodiments 1-14, wherein the first surface is separated from a second surface to define a rectangular cross section of the cooling duct.

Embodiment 16. The apparatus of any one of embodiments 1-15, wherein the cooling duct further comprises a second surface configured to define a nozzle with the first surface, wherein the nozzle provides the portion of the forced air to the portion of the bottom of the directional solidification crucible received by the orifice.

Embodiment 17. The apparatus of any one of embodiments 1-16, wherein the cooling duct is configured to provide the portion of the forced air substantially perpendicular to the portion of the bottom of the directional solidification crucible.

Embodiment 18. The apparatus of any one of embodiments 1-17, wherein the cooling duct includes a cooling duct inlet configured to provide the cooling duct with the forced air.

Embodiment 19. The apparatus of embodiment 18, wherein the cooling duct inlet includes at least one forced air inlet configured to receive forced air from a fan.

Embodiment 20. The apparatus of any one of embodiments 1-19, wherein the cooling duct is configured to provide the portion of the forced air in a substantially even pattern to the portion of the bottom of the directional solidification crucible.

Embodiment 21. The apparatus of any one of embodiments 1-20, wherein the portion of the forced air that is provided to the portion of the bottom of the directional solidification crucible is turbulent.

Embodiment 22. The apparatus of any one of embodiments 1-21, wherein a velocity of the portion of the forced air that is provided to the portion of the bottom of the directional solidification crucible is at least about 16 meters per second (m/s).

Embodiment 23. The apparatus of any one of embodiments 1-21, wherein a cubic velocity of the portion of the forced air that is provided to the portion of the bottom of the directional solidification crucible is at least about 5000 cubic feet per minute.

Embodiment 24. The apparatus of any one of embodiments 18-23, wherein the forced air received by the cooling duct inlet is about at ambient temperature.

Embodiment 25. The apparatus of any one of embodiments 1-24, further comprising a top heater including at least one heating member, the heating member including a heating element or an induction heater.

Embodiment 26. The apparatus of embodiment 25, wherein the top heater further comprises insulation, the insulation including an insulating brick, a refractory, a mixture of refractories, an insulating board, a ceramic paper, a high temperature wool, or a mixture thereof.

Embodiment 27. The apparatus of embodiment 26, wherein the top heater further comprises an outer jacket, wherein the insulation is disposed at least partially between the heating element and the top heater outer jacket.

Embodiment 28. The apparatus of embodiment 27, wherein the top heater outer jacket includes stainless steel.

Embodiment 29. The apparatus of any one of embodiments 1-28, wherein the directional solidification crucible further comprises an outer jacket, wherein the outer jacket defines the portion of the bottom of the directional solidification crucible that receives the portion of forced air.

Embodiment 30. A method for directional solidification including providing or receiving a first silicon, providing or receiving a directional solidification crucible including a bottom, and providing or receiving a cooling platform. The cooling platform includes a first surface defining an orifice configured to receive a portion of the bottom of the directional solidification crucible and a cooling duct configured to provide forced air to the portion of the bottom of the directional solidification crucible. The method further includes cooling the portion of the directional solidification crucible with the forced air and directionally solidifying the first silicon in the directional solidification crucible to provide a second silicon.

Embodiment 31. The method of embodiment 30, further comprising positioning a heater over the directional solidification crucible, including positioning a heating member selected from a heating element and an induction heater over the directional solidification crucible.

Embodiment 32. The method of embodiment 30 or 31, wherein the receiving comprises receiving the forced air from a fan.

Embodiment 33. The method of any one of embodiments 30-32, further comprising providing the forced air to the portion of the directional solidification crucible at a turbulent flow.

Embodiment 34. The method of any one of embodiments 30-33, further comprising providing the forced air perpendicular to the portion of the directional solidification crucible.

Embodiment 35. The method of any one of embodiments 30-34, further comprising substantially stopping the directionally solidifying the first silicon when about 80% of the first silicon is directly solidified to the second silicon, including stopping the cooling of the portion of the directional solidification crucible.

Embodiment 36. The method of any one of embodiments 30-35, further comprising adjusting a crystallization growth rate of the first silicon with the control of thermal profile of the directional solidification crucible or mould.

Embodiment 37. The method of embodiment 36, wherein adjusting the crystallization growth rate includes adjusting the cooling of the portion of the directional solidification crucible.

Embodiment 38. An apparatus for directional solidification including a directional solidification crucible including a bottom, a cooling platform. The cooling platform including a first surface defining an orifice configured to receive a portion of the bottom of the directional solidification crucible. The bottom of the directional solidification crucible includes silicon carbide, graphite, or a combination thereof and a plurality of veins configured to dissipate heat. The cooling platform further includes a cooling duct inlet below the first surface configured to receive forced air and a cooling duct configured to turbulently provide the forced air to the portion of the bottom of the directional solidification crucible. The apparatus further includes a top heater including a heating member, including a heating element or an induction heater, wherein the heating element includes silicon carbide, molybdenum disilicide, graphite, or a combination thereof.

EXAMPLES

Example 1

A directional solidification crucible was placed on a cooling platform. Molten silicon was poured into the directional solidification crucible. A top heater was placed over the crucible. The heater were set at 1450° C. for 14 hrs and then turned off Six hours later the top heater section was removed and the silicon was allowed to cool to room temperature and measurements were taken. The results are shown in FIG. 7 and FIG. 8.

Figure 7:
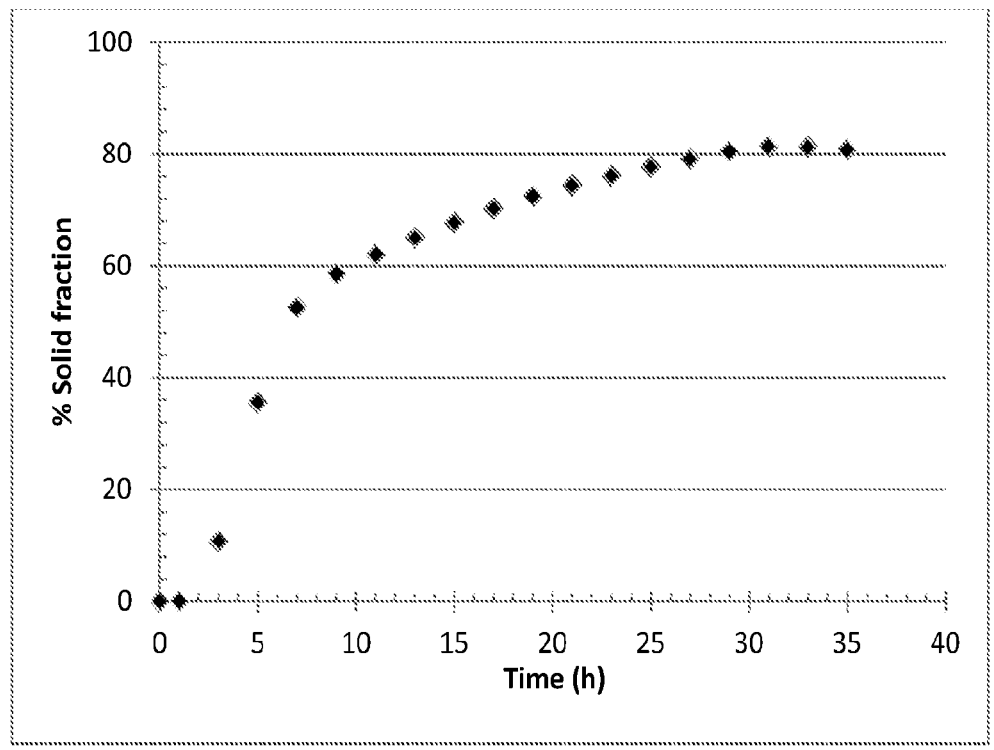
FIG. 7 is a graph showing the percent of silicon solidified over time during an example directional solidification of silicon.

FIG. 7 shows a plot of the percent of silicon solidified over the time.

Figure 8:
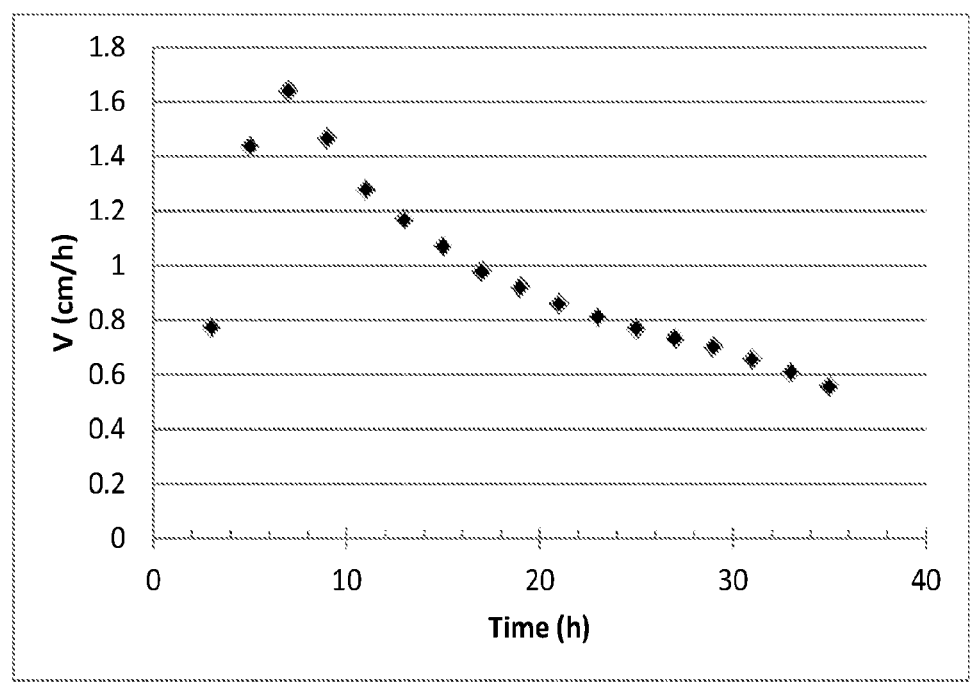
FIG. 8 is a graph showing the velocity of a silicon crystallization front over time during an example directional solidification of silicon.

FIG. 8 shows a plot of the velocity in centimeters per hour of the crystallization front over time.

Example 2

Example 1 was repeated with forced air contacting the bottom of the crucible. Measurements were taken; the results are shown in FIG. 9 and FIG. 10.

Figure 9:
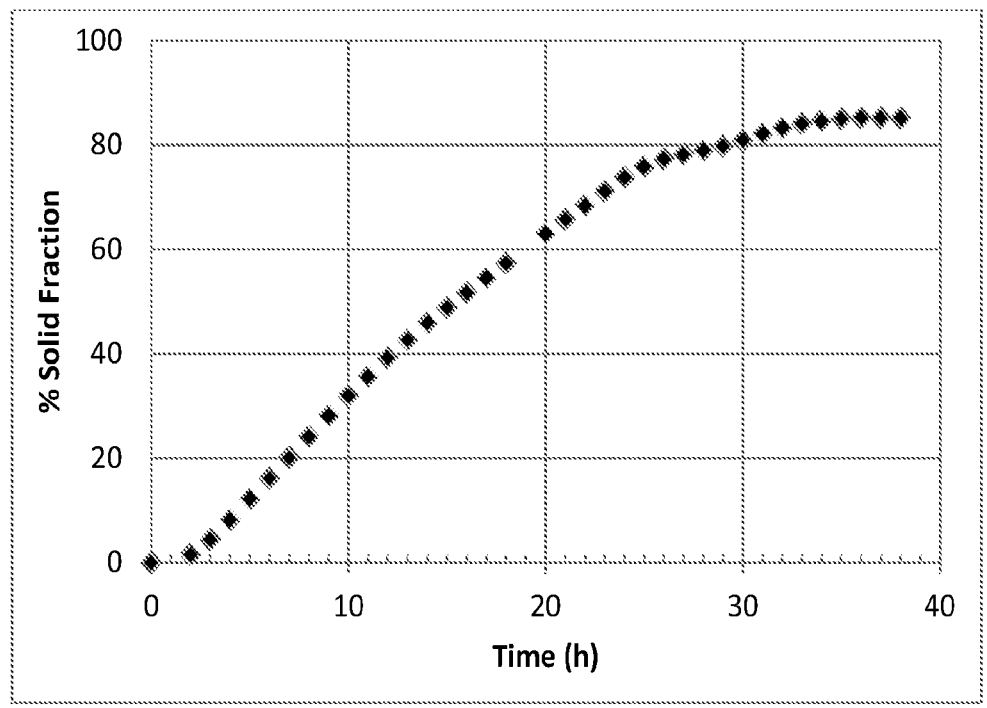
FIG. 9 is a graph showing the percent of silicon solidified over time during an example directional solidification of silicon.

FIG. 9 shows a plot of the percent of silicon solidified over the time.

Figure 10:
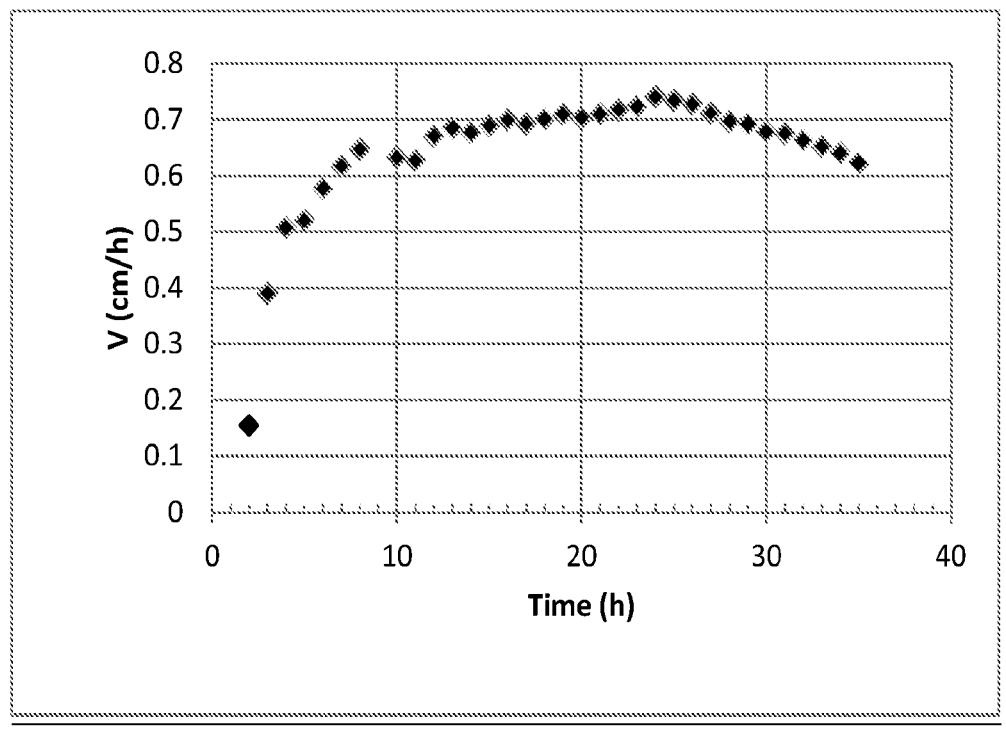
FIG. 10 is a graph showing the velocity of a silicon crystallization front over time during an example directional solidification of silicon.

FIG. 10 plots the velocity in centimeters per hour of the crystallization front over time.

Example 3

Figure 11:
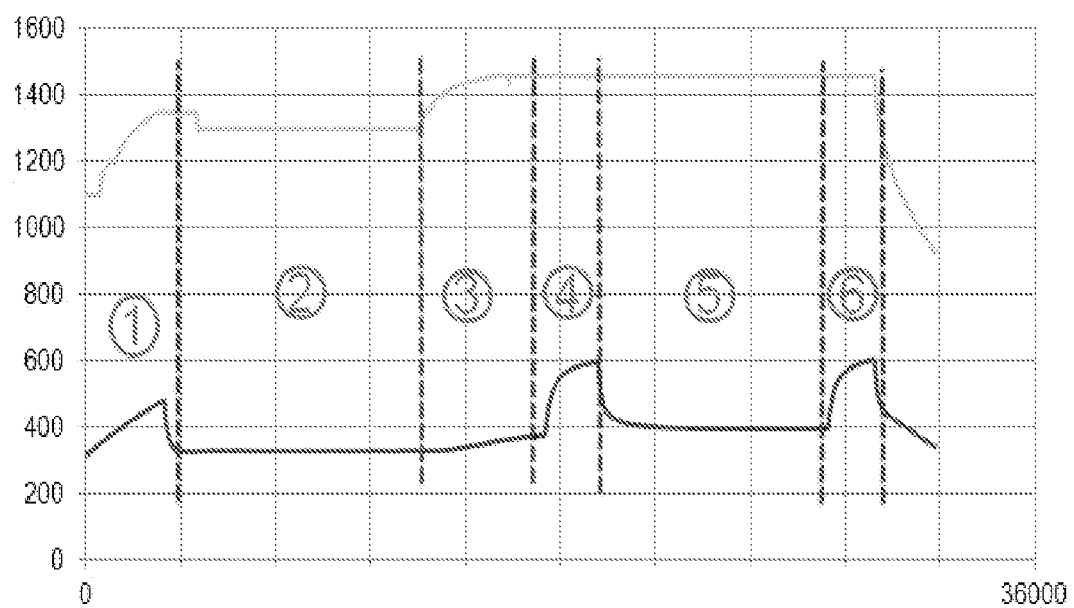
FIG. 11 is a plot of a process temperature profile and a measured temperature at a bottom of a directional solidification crucible over time for a number of heating and cooling cycles for an example directional solidification of silicon.

Molten silicon was poured into a directional solidification mold and subjected to a number of heating and cooling cycles. The heating and cooling cycles are summarized in Table 1. Cooling was accomplished with a cooling platform as described herein. Heating was accomplished with a top heater as described herein. Measurements were taken during the six separate heating and cooling cycles. The measurements are summarized in FIG. 11, FIG. 11 shows a plot of Temperature (° C.) versus time (minutes). The top plot is the process temperature and the bottom plot is the temperature measured at the bottom of the directional solidification crucible. The plot is separated into six sections corresponding the cycle numbers in Table 1.

TABLE 1

Heating and Cooling Cycle Conditions.

| Cycle Number | Cooling | Heating |
| --- | --- | --- |
| 1 | No | Increased to 1350° C. |
| 2 | Yes | Held at 1350° C. |
| 3 | Yes | Increased to 1460° C. |
| 4 | No | Held at 1460° C. |
| 5 | Yes | Held at 1460° C. |
| 6 | No | Held at 1460° C. |

What is claimed is:

1. An apparatus for directional solidification, comprising:
a directional solidification crucible including a bottom portion; and
a cooling platform, including a first surface defining an orifice configured to receive a bottom portion of the directional solidification crucible, wherein the bottom portion sits within the orifice; and
a cooling duct configured to provide a portion of forced air to the bottom portion of the directional solidification crucible.

2. The apparatus of claim 1, wherein a plurality of side walls of the directional solidification crucible include a hot face refractory.

3. The apparatus of claim 1, wherein the bottom portion of the directional solidification crucible includes a conducting refractory.

4. The apparatus of claim 1, wherein the bottom portion of the directional solidification crucible dissipates heat at a rate of about 10% per hour of the total heat that is to be dissipated from the crucible with the forced air.

5. The apparatus of claim 1, wherein at least the bottom portion of the directional solidification crucible includes a plurality of heat transfer fins configured to dissipate heat.

6. The apparatus of claim 5, wherein at least a portion of the plurality of heat transfer fins extend outwardly along the bottom portion of the directional solidification crucible.

7. The apparatus of claim 1, wherein at least the portion of the bottom portion of the directional solidification crucible includes a convex surface configured to sit within the orifice.

8. The apparatus of claim 1, wherein the orifice receives substantially a center of the bottom portion of the directional solidification crucible.

9. The apparatus of claim 1, wherein the orifice is configured to receive the bottom portion of the directional solidification crucible by permitting the crucible to rest substantially level on the cooling platform.

10. The apparatus of claim 1, wherein the orifice is configured to receive about 25% of a surface area of the bottom portion of the directional solidification crucible.

11. The apparatus of claim 1, wherein the orifice is either circular or rectangular.

12. The apparatus of claim 1, wherein the cooling duct further comprises a second surface configured to define a nozzle with the first surface, wherein the nozzle provides the portion of the forced air to the bottom portion of the directional solidification crucible received by the orifice.

13. The apparatus of claim 1, wherein the cooling duct is configured to provide the portion of the forced air substantially perpendicular to the bottom portion of the directional solidification crucible.

14. The apparatus of claim 1, wherein the cooling duct is configured to provide the portion of the forced air in a substantially even pattern to the bottom portion of the directional solidification crucible.

15. The apparatus of claim 1, wherein the portion of the forced air that is provided to the bottom portion of the directional solidification crucible is turbulent.

16. The apparatus of claim 1, wherein a velocity of the portion of the forced air that is provided to the bottom portion of the directional solidification crucible is at least about 16 meters per second.

17. The apparatus of claim 1, further comprising a top heater including at least one heating member, the heating member including a heating element or an induction heater.

18. The apparatus of claim 1, wherein the directional solidification crucible further comprises an outer jacket, wherein the outer jacket defines the bottom portion of the directional solidification crucible that receives the portion of forced air.

19. An apparatus for directional solidification, comprising:
a directional solidification crucible including a bottom portion;
a cooling platform, including a first surface defining an orifice configured to receive a portion of the directional solidification crucible, wherein the bottom portion sits within the orifice, and wherein the bottom portion of the directional solidification crucible includes silicon carbide, graphite, or a combination thereof; and
a plurality of fins to dissipate heat;
a cooling duct inlet below the first surface configured to receive forced air; and
a cooling duct configured to turbulently provide the forced air to the bottom portion of the directional solidification crucible; and
a top heater, including a heating member, including a heating element or an induction heater, wherein the heating element includes silicon carbide, molybdenum disilicide, graphite, or a combination thereof.

* * * * *